US012597457B2

(12) United States Patent
Sato

(10) Patent No.: US 12,597,457 B2
(45) Date of Patent: Apr. 7, 2026

(54) INITIAL SETTING DEVICE OF SEMICONDUCTOR MEMORY TO DETERMINE VALID SETTING

(71) Applicant: Winbond Electronics Corp., Taichung City (TW)

(72) Inventor: Takahiko Sato, Yokohama (JP)

(73) Assignee: WINBOND ELECTRONICS CORP., Taichung City (TW)

( * ) Notice: Subject to any disclaimer, the term of this patent is extended or adjusted under 35 U.S.C. 154(b) by 161 days.

(21) Appl. No.: 18/462,024

(22) Filed: Sep. 6, 2023

(65) Prior Publication Data

US 2024/0339148 A1     Oct. 10, 2024

(30) Foreign Application Priority Data

Apr. 7, 2023     (JP) ................................. 2023-062895

(51) Int. Cl.
G11C 11/4072          (2006.01)

(52) U.S. Cl.
CPC ................................ G11C 11/4072 (2013.01)

(58) Field of Classification Search
CPC ... G11C 11/4072; G11C 17/143; G11C 17/18; G11C 17/16; G11C 7/20
See application file for complete search history.

(56) References Cited

U.S. PATENT DOCUMENTS 9,665,490 B2     5/2017   Henry et al.
10,892,030 B2 *  1/2021   Arai ..................... G11C 29/006

11,393,539 B2 *   7/2022   Bhatia ...................... G06N 3/09
2010/0332773 A1   12/2010  Park
2020/0365212 A1   11/2020  Lee
2021/0343348 A1 * 11/2021  Matsunaga ........... G06F 3/0619
(Continued)

FOREIGN PATENT DOCUMENTS

CN        111400209 A     7/2020
JP        2001-176290 A   6/2001
JP        2004-152413 A   5/2004
(Continued)

OTHER PUBLICATIONS

Korean Office Action for Korean Application No. 10-2023-0071212, dated Jul. 26, 2024, with English translation.

*Primary Examiner* — Sultana Begum
(74) *Attorney, Agent, or Firm* — Birch, Stewart, Kolasch & Birch, LLP

(57)          ABSTRACT

The present invention provides an initial setting device of semiconductor memory, which includes a voltage detection part, a first non-volatile memory device, a control unit, and a determination unit. The voltage detection part detects the voltage of the power supply. The first non-volatile memory device stores the first setting information, which is used for setting the operation condition of the semiconductor memory. The control unit reads the first setting information from the first non-volatile memory device according to the voltage level of the detected power supply. The determination unit determines whether first setting information that was read is valid. The reading condition of the first setting information is changed and the first setting information is read simultaneously every time the first setting information is determined as invalid until the first setting information is determined as valid.

16 Claims, 5 Drawing Sheets

(56)　　　　　References Cited

U.S. PATENT DOCUMENTS

2023/0085319 A1　　3/2023　Jung et al.

FOREIGN PATENT DOCUMENTS

| KR | 10-2009-0094367 A | 9/2009 | |
| KR | 10-2020-0056880 A | 5/2020 | |
| KR | 10-2022-0022104 A | 2/2022 | |
| TW | 419828 B | 1/2001 | |
| TW | 200713287 A | 4/2007 | |
| WO | WO-2004012196 A2 * | 2/2004 | .......... G11C 7/1045 |

* cited by examiner

INITIAL SETTING DEVICE OF SEMICONDUCTOR MEMORY TO DETERMINE VALID SETTING

CROSS REFERENCE TO RELATED APPLICATIONS

This application claims priority of Japanese Patent Application No. 2023-062895, filed on Apr. 7, 2023, the entirety of which is incorporated by reference herein.

BACKGROUND OF THE INVENTION

Field of the Invention

The disclosure is related to an initial setting device of a semiconductor memory.

Description of the Related Art

In a traditional initial setting device, when an external power source is input to the semiconductor memory, it is known that a non-volatile memory device disposed in the semiconductor memory is configured to read the setting information from the non-volatile memory device that stores the setting information. The information is used to set the operating conditions of the semiconductor memory (such as the operating voltage of the semiconductor memory, etc.).

BRIEF SUMMARY OF THE INVENTION

Since the above-mentioned initial setting device reads the setting information when the external power supply is supplied to the semiconductor memory, the setting information may not be read correctly according to the voltage of the external power supply or the internal power supply generated based on the external power supply. At this time, since an appropriate initial setting operation cannot be performed based on valid setting information, errors and malfunctions may occur.

In order to solve the above-mentioned problem, the present invention provides an initial setting device of semiconductor memory, which comprises a voltage detection part, a first non-volatile memory device, a control unit, and a determination unit determining whether the read first setting information is valid. The voltage detection part detects the voltage of the power supply. The first non-volatile memory device stores the first setting information, which is used for setting the operation condition of the semiconductor memory. The control unit reads the first setting information from the first non-volatile memory device according to the voltage level of the detected power supply. The determination unit determines whether the first setting information that was read is valid. The reading condition of the first setting information is changed and the first setting information is read simultaneously every time the first setting information is determined as invalid until the first setting information is determined as valid.

In summary, according to the initial setting device of the present invention, the initial setting of the semiconductor memory can be performed based on valid setting information.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
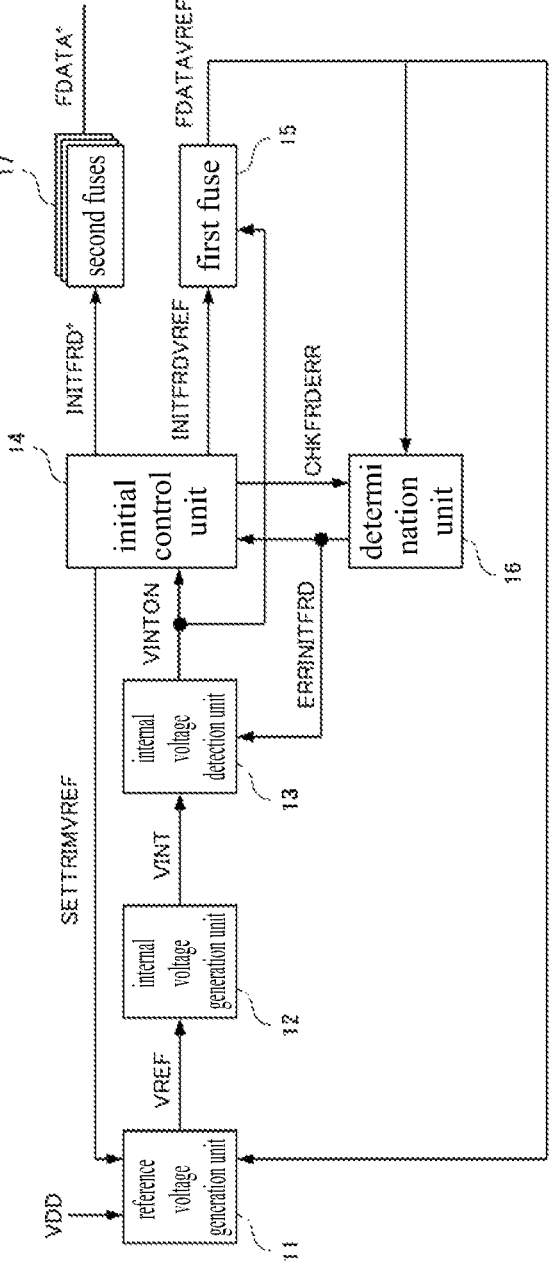
FIG. 1 is a block diagram of an example of the configuration of the initial setting device in accordance with the first embodiment of the present invention.

FIG. 1 is a block diagram of an example of the configuration of an initial setting device of a semiconductor memory in accordance with a first embodiment of the present invention. The initial setting device is disposed in the semiconductor memory (for example: Dynamic Random Access Memory (DRAM)), configured to perform the initial setting of the semiconductor memory. In this embodiment example, the initial setting device includes a reference voltage generation unit 11, an internal voltage generation unit 12, an internal voltage detection unit 13, an initial control unit 14, a first fuse 15, a determination unit 16, and one or more second fuses 17.

The reference voltage generation unit 11 receives the external power supply voltage VDD, generates a reference voltage VREF based on the external power supply voltage VDD, and supplies the reference voltage VREF to the internal voltage generation unit 12 and other circuits driven by the reference voltage VREF (not shown). In an embodiment, the reference voltage VREF is less than the external power supply VDD.

In one embodiment, the fuse 15 stores information including the first setting information used to adjust the external power supply voltage VDD to generate a reference power voltage (reference voltage VREF). The reference voltage generation unit 11 generates a reference voltage VREF based on the first setting information read from the fuse 15. In addition, the reference voltage generation unit 11 is an example of a "voltage generating unit" in the present invention.

In order to adjust the reference voltage VREF based on the first setting information read from the fuse 15, the reference voltage generation unit 11 adjusts the reference voltage VREF based on the first setting information indicated by the signal FDATAVREF input from the fuse 15 when the signal SETTRIMVREF for indicating is input from the initial control unit 14 in a valid (high level) state. In addition, when the reference voltage generation unit 11 receives the signal SETTRIMVREF from the initial control unit 14 in an inactive (low level) state, the reference voltage generation unit 11 may also generate the reference voltage VREF without the signal FDATAVREF (first setting information).

The internal voltage generation unit 12 receives the external power supply VDD and the reference voltage VREF, generates an internal voltage VINT based on the external power supply VDD and the reference voltage VREF, and supplies the internal voltage VINT to the internal voltage detection unit 13 and other circuits driven by VINT (not shown). In an embodiment, the generated internal voltage VINT exceeds the reference voltage VREF.

The internal voltage detection section 13 receives and detects the internal voltage VINT, and outputs an effective trigger signal VINTON (high level) to the initial control unit 14 and the fuse 15 at each time that the detected internal voltage VINT reaches a specific target level. The effective trigger signal VINTON is used to instruct the fuse 15 to start reading the first setting information. In addition, the internal voltage detection unit 13 is an example of the "voltage detection unit" of this invention.

In the sequence when the external power supply is just input into the semiconductor memory, the reference voltage VREF is in an unadjusted state. At this time, due to the influence of the manufacturing conditions of the semiconductor memory or the usage environment, etc., the voltage level indicating the trigger signal VINTON being valid may deviate from the target level.

In addition, the internal voltage detection unit 13 is configured to perform the following function. After the trigger signal VINTON is enabled (high level) and output, the target level of the internal voltage VINT is raised when the valid (high level) state of the signal ERRINITFRD indicating whether the first setting information read from the fuse 15 is valid (that is, the state in which the first setting information is determined to be invalid) is input from the determination unit 16. That is, it is configured to increase the target level of the internal voltage VINT every time the first setting information is determined to be invalid.

The initial control unit 14 is configured to read the first setting information of the fuse 15 according to the effective trigger signal VINTON (high level). Specifically, when the valid trigger signal VINTON is input from the internal voltage detection unit 13, the initial control unit 14 makes the signal INITFRDVREF for reading the first setting information valid (high level) and outputs the signal INITFRDVREF to the fuse 15. In addition, the initial control unit 14 simultaneously makes the signal CHKFRDERR valid (high level) and outputs the signal CHKFRDERR to the determination unit 16, where the signal CHKFRDERR is used for determining whether the first setting information is valid or not. In addition, the initial control unit 14 is an example of a "control unit" in the present invention.

In addition, when the input ERRINITFRD is input in the invalid (low level) state (i.e., the first setting information is determined to be valid), the start control unit 14 may make the signal SETTRIMVREF valid (high level) and output the signal SETTRIMVREF to the reference voltage generation unit 11. Therefore, the reference voltage generation unit 11 may generate the reference voltage VREF based on the first setting information being valid.

Furthermore, the initial control unit 14 is configured to change the reading condition of the first setting information every time that the first setting information is determined to be invalid, and re-read the first setting information until the first setting information is determined to be valid.

In one embodiment, the initial control unit 14 can change the reading condition of the first setting information by changing the voltage of the signal INITFRDVREF each time when the first setting information is determined to be invalid. In addition, the change of the voltage level of the signal INITFRDVREF (for example: increase, etc.) may also be performed by the change of the detection level (for example: increase, etc.) of the trigger signal VINTON of the internal voltage detection unit 13.

In another embodiment, the initial control unit 14 can also change the reading condition of the first setting information by extending the read time of the first setting information (for example: extending the pulse width of the signal INITFRDVREF) every time that the first setting information is determined to be invalid.

In one embodiment, when the first setting information is determined to be valid, the initial control unit 14 may read the second setting information from one or more fuses 17 storing the second setting information that is different from the first setting information. Specifically, the initial control unit 14 is configured to read the signal INITFRD* indicating the second setting information being valid (high level) when the signal ERRINITFRD input from the determination unit 16 is in an invalid (low level) state (that is, the first setting information is determined to be valid), and outputs to one or more fuses 17. Therefore, since the second setting information is read from one or more fuses 17 with the same setting as the case where the first setting information is determined to be valid, for example, the possibility of reading valid second setting information can be increased compared to reading the second setting information whether the first setting information is valid or not.

The fuse 15 is configured to store first setting information for setting the operating conditions of the semiconductor memory. In addition, when the signal INITFRDVREF is input from the initial control unit 14, the fuse 15 outputs a signal FDATAVREF indicating the first setting information stored inside to the determination unit 16 and the reference voltage generation unit 11. In addition, the fuse 15 is an example of the "first non-volatile memory device" in the present invention.

In this embodiment, the fuse 15 includes a set (two in this example) of non-volatile memories 15a, 15b for storing information about the first setting information. Here, one set of non-volatile memory units 15a and 15b may be formed of fuse ROMs. By correctly reading the first setting information stored in the fuse ROMs, the initial setting of the semiconductor memory can be performed. In addition, a set of non-volatile memory units 15a, 15b may also be composed of other fuses, such as laser fuses.

In addition, in this embodiment, the value of a specific number of bits (for example: 1 bit, etc.) representing the first setting information is stored by the non-volatile memory portion 15a, and the value of a specific number of bits representing the first setting information is stored in an inverted state by the non-volatile memory portion 15b. For example, in cases where the first setting information is configured as 1 bit, and the value of the 1 bit is "1", the bit value "1" is stored in the non-volatile memory unit 15a, and the bit value "0" is stored in the volatile memory unit 15b. In addition, the non-volatile memory unit 15a is an example of the "first non-volatile memory unit" in the present invention, and the non-volatile memory unit 15b is an example of the "second non-volatile memory unit" in the present invention.

The determination unit 16 determines whether the first setting information read from the fuse 15 is valid. Specifically, when the signal CHKFRDERR input from the initial control unit 14 is in a valid (high level) state, the determination unit 16 determines whether the first setting information is valid. The first setting information is indicated by the signal FDATAVREF input from the fuse 15. Next, when the first setting information is determined invalid, the determination unit 16 makes the signal ERRINITFRD valid (high level) and outputs the signal ERRINITFRD to the internal voltage detecting unit 13 and the initial control unit 14. On the other hand, when the first setting information is determined to be valid, the determination unit 16 makes the signal ERRINITFRD invalid (low level) and outputs it to the internal voltage detection unit 13 and the initial control unit 14. In addition, the determination unit 16 is an example of a "discrimination unit" in this invention.

In addition, the determination unit 16 is configured to determine whether the first setting information is valid or not by comparing the information respectively read from a set of non-volatile memory units 15a, 15b. In this embodiment, the determination unit 16 determines that the first setting information is valid under the condition that the bit values read from the non-volatile memory units 15a and 15b are different. Therefore, the validity of the first setting information can be easily determined.

One or more fuses 17 are configured to store second setting information that is different from the first setting information, and the second setting information is used to set the second initial information of the operating condition of the semiconductor memory. In addition, when the signal INITFRD* for reading the second setting information is input from the initial control unit 14, one or more fuses 17 output the signal FDATA* indicating the second setting information to specific devices or circuits within the semiconductor memory (for example: redundant circuits for failed memory cells (not shown in FIG. 1), etc.). Here, one or more fuses 17 may be constituted by fuse ROMs, or may be constituted by other fuses such as laser fuses. In addition, one or more fuses 17 are an example of the "second non-volatile memory device" in the present invention.

Figure 2:
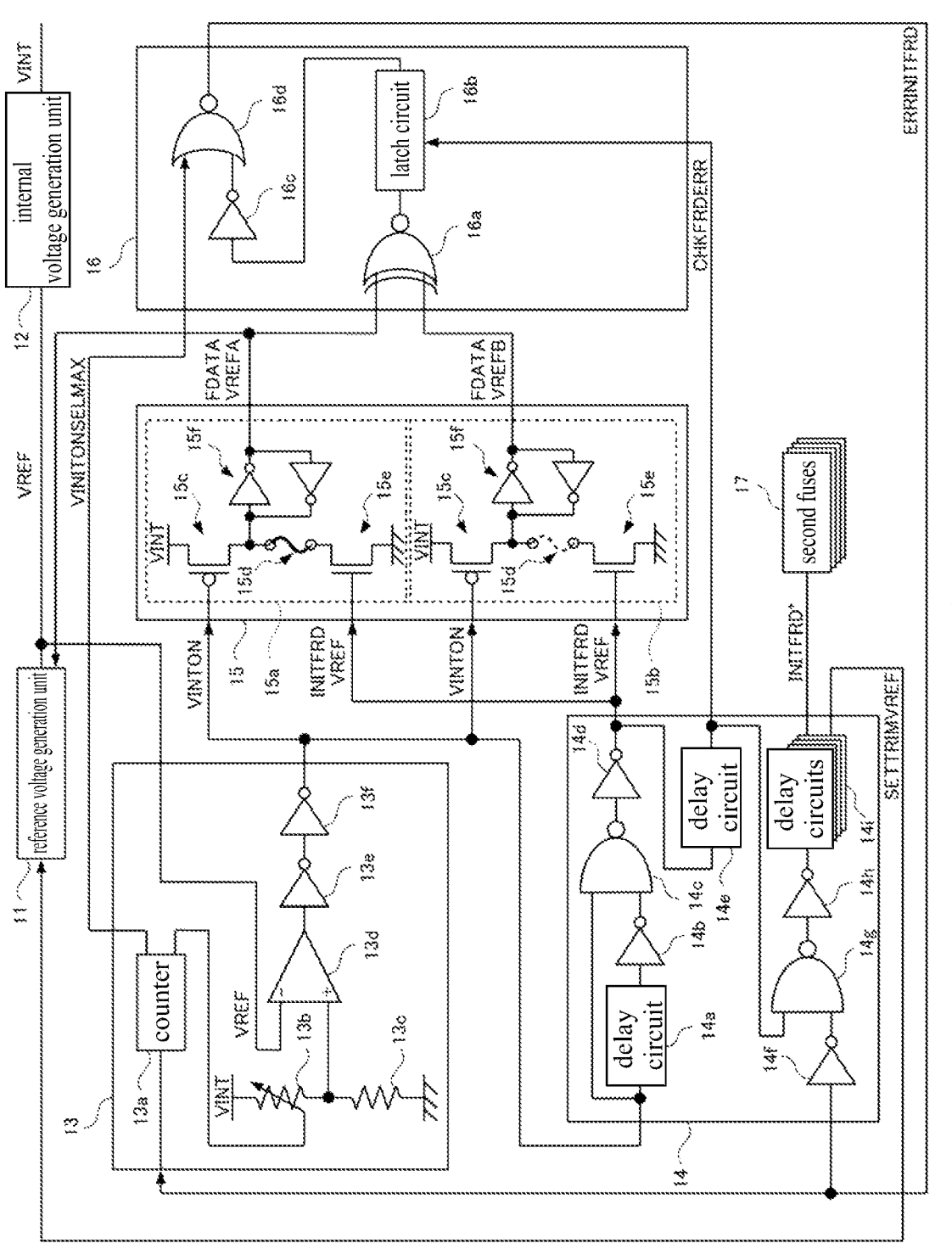
FIG. 2 is a schematic diagram showing a detailed configuration example of each part of the initial setting device.

FIG. 2 is a schematic diagram of a detailed configuration example of each part of the initial setting device in accordance with the first embodiment of the present invention. Referring to FIG. 2, the internal voltage detection unit 13 includes a counter 13a, a variable resistor 13b, a resistor 13c, a comparator 13d, and two inverters 13e and 13f connected in series.

The counter 13a is configured to increment the count value indicating that the first setting information is determined to be invalid by 1 when the signal ERRINITFRD input from the determination portion 16 is valid (high level) (that is, the first setting information is determined to be invalid). In addition, the counter 13a outputs the signal indicating the counting value to the variable resistor 13b. Furthermore, the counter 13a outputs the signal VINTON-SELMAX indicating the count value reaching the maximum value that is valid (high level) to the determination unit 16 when the count value has reached the maximum value. Here, the counter 13a may reset the count value to an initial value (e.g., 0) when the count value reaches the maximum value. Furthermore, the counter 13a may also reset the count value to an initial value when power is input to the semiconductor memory, or when the power input to the semiconductor memory device is blocked.

The variable resistor 13b and the resistor 13c are connected in series between the internal power supply VINT and the ground. The variable resistor 13b is configured to change the resistance value according to the count value output from the counter 13a. For example, the resistance value of the variable resistor 13b increases as the count value increases. In addition, the connection node between the variable resistor 13b and the resistor 13c is connected to the "+" terminal of the comparator 13d.

The "−" terminal of the comparator 13d is supplied with the reference voltage VREF generated by the reference voltage generation unit 11. In addition, the output terminal of the comparator 13d is connected to the input terminal of the inverter 13e.

The inverter 13f inverts the logic of the signal input from the inverter 13e, and outputs the logic inverted signal to the initial control unit 14 and the fuse 15 as the trigger signal VINTON.

Referring to the FIG. 2, the initial control unit 14 includes a delay circuit 14a, an inverter 14b, a NAND circuit 14c, an inverter 14d, a delay circuit 14e, an inverter 14f, a NAND circuit 14g, a device 14h, and one or more delay circuits 14i.

The delay circuit 14a is configured to input the trigger signal VINTON, delay the input trigger signal VINTON for a specific period, and output the delayed signal to the inverter 14b.

The inverter 14b inverts the logic of the signal input from the delay circuit 14a, and outputs the logic inverted signal to the NAND circuit 14c.

The trigger signal VINTON is input to one of the input terminals of the NAND circuit 14c. In addition, the signal output from the inverter 14b is input to the other input terminal of the NAND circuit 14c. The NAND circuit 14c performs NAND calculation based on the input signals, and outputs the signal as the calculation result to the inverter 14d.

Figure 3:
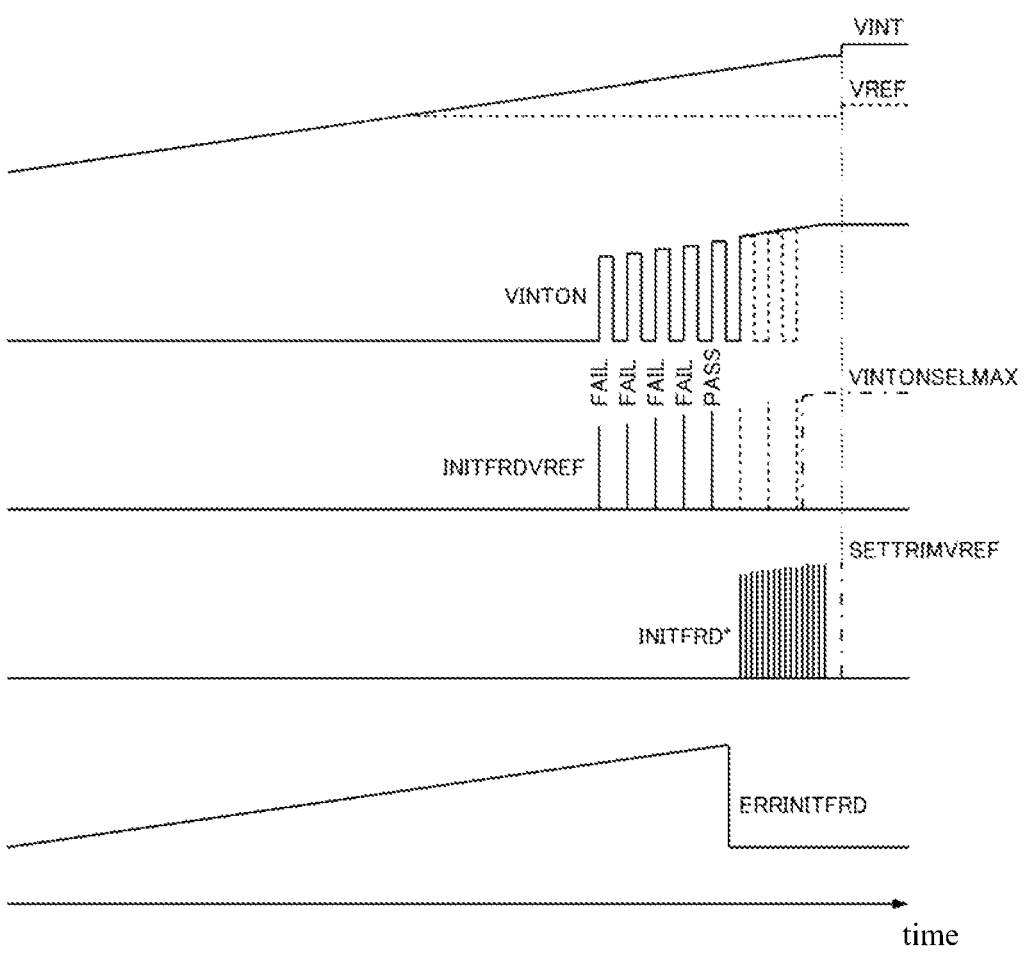
FIG. 3 and FIG. 5 are timing diagrams of signal timing in the initial setting device.

The inverter 14d inverts the logic of the signal input from the NAND circuit 14c, and outputs the logic inverted signal to the delay circuit 14e and the fuse 15 as a signal INITFRDVREF. Here, the inverter 14d outputs a high pulse as the signal INITFRDVREF based on the rising edge of the trigger signal VINTON as shown in FIG. 3, which will be described in the following paragraphs.

The delay circuit 14e delays the signal INITFRDVREF input from the inverter 14d by a specific period, and outputs the delayed signal as a signal CHKFRDERR to the NAND circuit 14g and the determination unit 16.

The inverter 14f inverts the logic of the signal ERRIN-ITFRD input from the discrimination unit 16, and outputs the logic inverted signal to the NAND circuit 14g.

The signal CHKFRDERR is input to one of the input terminals of the NAND circuit 14g. In addition, the signal output from the inverter 14f is input to the other one of the input terminals of the NAND circuit 14g. The NAND circuit 14g performs NAND calculation based on the input signal, and outputs the signal as the calculation result to the inverter 14h.

The inverter 14h inverts the signal input from the NAND circuit 14g, and outputs the logic inverted signal to one or more delay circuits 14i.

One or more delay circuits 14i delay each of the signals input from the inverter 14h for a specific period, and output the delayed signals as signals INITFRD* to one or more fuses 17. In addition, when one or more delay circuits 14i respectively output the signal INITFRD* to one or more fuses 17, the signal SETTRIMVREF is valid (high level) and output to the reference voltage generation unit 11.

Referring to FIG. 2 again, the fuse 15 includes non-volatile memory units 15a and 15b. The non-volatile memory units 15a and 15b respectively include: a Metal-Oxide-Semiconductor Field Effect Transistor (MOSFET) 15c, a fuse resistor 15d, a MOSFET 15e, and a latch circuit 15f composed of two inverters. In this embodiment, MOS-FET 15c is P-type, and MOSFET 15c is N-type. The fuse resistor 15d of the non-volatile memory unit 15a being in the connected state and the fuse resistor 15d of the non-volatile memory unit 15b being in the cut-off state are illustrated herein. However, in other embodiments, the fuse resistor 15d of the non-volatile memory unit 15a may be in the cut-off state, and the fuse resistor 15d of the non-volatile memory unit 15b may be in the connected state.

The sources of the MOSFETs 15c of the non-volatile memory units 15a and 15b are connected to the internal voltage VINT, and the drains of the MOSFETs 15c are connected to one terminal of the fuse resistor 15d. The trigger signal VINTON is input to the gate of MOSFET 15c. Furthermore, the connection node between the drain of the MOSFET 15c and the fuse resistor 15d is connected to the input terminal of any one of the two inverters of the latch circuit 15f.

The drains of the MOSFETs 15e of the non-volatile memory units 15a and 15b are connected to the other terminal of the fuse resistor 15d, and the sources of the MOSFETs 15e are connected to the low-voltage power supply. In addition, the signal INITFRDVREF is input to the gate of the MOSFET 15e.

The latch circuit 15f of the non-volatile memory unit 15a inverts the signal input from the connection node between the drain of the MOSFET 15c and the fuse resistor 15d, and outputs the logic inverted signal to the reference voltage generation unit 11 and the determination unit 16 as the signal FDATAVREFA (corresponding to the signal FDATAVREF shown in FIG. 1), and the signal FDATAVREFA indicates the first setting information stored in the non-volatile memory unit 15a.

The latch circuit 15f of the non-volatile memory unit 15b inverts the signal input from the connection node between the drain of the MOSFET 15c and the fuse resistor 15d, and outputs the logic inverted signal to the reference voltage generation unit 11 and the determination unit 16 as the signal FDATAVREFB (corresponding to the signal FDATAVREF shown in FIG. 1), and the signal FDATAVREFB indicates the first setting information stored in the non-volatile memory unit 15b.

Referring to FIG. 2 again, the determination unit 16 includes an EXNOR circuit 16a, a latch circuit 16b, an inverter 16c, and a NOR circuit 16d.

The signal FDATAVREFA output from the non-volatile memory unit 15a is input to one input terminal of the EXNOR circuit 16a. In addition, the signal FDATAVREFB output from the non-volatile memory unit 15b is input to the other input terminal of the EXNOR circuit 16a. The EXNOR circuit 16a performs EXNOR calculation based on the input signals, and outputs a signal as a calculation result to the latch circuit 16b.

The latch circuit 16b latches the signal input from the EXNOR circuit 16a, and outputs the latched signal to the inverter 16c when the signal CHKFRDERR input from the initial control unit 14 is valid (high level).

The inverter 16c inverts the signal input from the latch circuit 16b, and outputs the logic inverted signal to the NOR circuit 16d.

The signal VINTONSELMAX output from the internal voltage detection unit 13 is input to one terminal of the NOR circuit 16d. In addition, the signal output from the inverter 16c is input to the other terminal of the NOR circuit 16d. The NOR circuit 16d performs NOR calculation based on the input signal, and outputs the signal of the calculation result to the internal voltage detection unit 13 and the initial control unit 14 as a signal ERRINITFRD.

FIG. 3 is a timing diagram showing the timing of signals in the initial setting device in accordance with the first embodiment of the present invention. FIG. 2 and FIG. 3 are referred at the same time. First, when the external power is input to the semiconductor memory, the reference voltage generation unit 11 generates the reference voltage VREF based on the external voltage VDD. In addition, the internal voltage generation unit 12 generates the internal voltage VINT based on the external voltage VDD and the reference voltage VREF.

Here, during the period when the level of the internal voltage VINT is less than the level of the reference voltage VREF after the level of the internal voltage VINT is divided by the resistance 13b and the resistance 13c, the comparator 13d outputs a signal of at the low level to trigger the signal VINTON to be at the low level. At this time, the MOSFETs 15c of the non-volatile memory units 15a and 15b are turned on. On the other hand, the respective MOSFETs 15e of the non-volatile memory units 15a and 15b are turned off because the signal INITFRDVREF is at the low level. Therefore, the signals FDATAVREFA and FDATAVREFB respectively output from the two non-volatile memory units 15a and 15b of the fuse 15 are both at the low level.

Next, when the voltage level of the internal voltage VINT reaches a specific target level higher than the level of the reference voltage VREF after being divided by the resistor 13b and the resistor 13c, the comparator 13d outputs a high-level signal to trigger the signal VINTON become the high level. At this time, the MOSFETs 15c of the nonvolatile memory units 15a and 15b are turned off. In addition, after the trigger signal VINTON becomes high level and a certain period has been elapsed, a high-level signal INITFRDVREF is output from the initial control unit. Therefore, the first setting information can be read from the fuse 15.

At this time, the non-volatile memory portion 15a operates in the following manner: the MOSFET 15e is turned on by inputting a high-level signal INITFRDVREF, and the current flows to the low-voltage power supply through the fuse resistor 15d and the MOSFET 15e, thereby reducing the voltage level of the latch circuit 15f (that is, the bit value latched in the latch circuit 15f is inverted). However, when the voltage level of the signal INITFRDVREF is low, the voltage level of the latch circuit 15f cannot be sufficiently lowered, and as a result, the low-level signal FDATAVREFA is output from the non-volatile memory unit 15a.

On the other hand, the fuse resistor 15d of the non-volatile memory portion 15b is cut off. Therefore, even when the MOSFET 15e is turned on due to the input of the high-level signal INITFRDVREF, the voltage level of the latch circuit 15f does not drop. Therefore, the low-level signal FDATAVREFB is output from the non-volatile memory portion 15b.

Therefore, the non-volatile memory units 15a and 15b of the fuse 15 respectively output the low-level signals FDATAVREFA and FDATAVREFB which indicate the bit value of the setting information as 0. In this case, when a valid (high level) signal ERRINITFRD is input, the determination unit 16 outputs the signal CHKFRDERR as valid (high level) (that is, it is determined that the first setting information is invalid).

In addition, the counter 13a of the internal voltage detection unit 13 increases the count value by 1 when the valid (high level) signal ERRINITFRD is input. Therefore, the internal voltage detection unit 13 raises the target level of the internal voltage VINT. In this case, the resistance value of the variable resistor 13b of the internal voltage detection unit 13 increases as the count value increases, so that the voltage level of the signal input to the "+" terminal of the comparator 13d becomes lower than that of the input "−" terminal (reference voltage VREF). Therefore, the low level signal output from the comparator 13d triggers the signal VINTON to temporarily become low-level.

Next, when the internal voltage VINT rises to the target level, the comparator 13d outputs a high-level signal to trigger the signal VINTON to become high-level. Then, as described above, the first setting information is read again from the fuse 15.

Every time that the first setting information is determined to be invalid, the level of the internal voltage VINT is raised as the target level of the internal voltage VINT rises repeatedly, and the trigger levels of the signal VINTON and the signal INITFRDVREF are raised according to the level of the internal voltage VINT. Next, when the signal INITFRDVREF reaches a specific voltage level, since the voltage level of the latch circuit 15*f* drops sufficiently, the non-volatile memory unit 15*a* outputs a high-level signal FDATAVREFA indicating that the bit value of the first setting information is 1. In this case, the determination unit 16 outputs an invalid (low level) signal ERRINITFRD when the valid (high level) signal CHKFRDERR is input (that is, it is determined that the first setting information is valid).

The initial control unit 14 outputs the valid (high level) signal INITFRD* from one or more delay circuits 14*i* to one or more fuses 17 when the invalid signal ERRINITFRD (low level) is input. On the other hand, when the signal INITFRD* is input from the corresponding delay circuit 14*i* of one or more delay circuits 14*i*, one or more fuses 17 output the signal FDATA* of the second setting information respectively as shown in FIG. 1. Thereby, when it is determined that the first setting information is valid, the second setting information is read from one or more fuses 17.

In addition, when the initial control unit 14 outputs the signal INITFRD* to one or more fuses 17, the signal SETTRIMVREF is valid (high level) and output to the reference voltage generation unit 11. In this case, when the signal SETTRIMVREF is input from the initial control unit 14 in a valid (high level) state, the reference voltage generation unit 11 adjusts the reference voltage VREF based on the first setting information indicated by the signal FDATA input from the fuse 15. Here, when the first setting information is set to raise the reference voltage VREF by a specific value or by a specific ratio, the reference voltage generation unit 11 may also raise the level of the reference voltage VREF by a specific value or by a specific ratio based on the first setting information, so as to adjust the reference voltage VREF. In addition, the internal voltage generation unit 12 may also increase the level of the internal voltage VINT by a specific value or a specific ratio based on the adjusted reference voltage VREF to adjust the internal voltage VINT. Therefore, in the embodiment shown in FIG. 3, according to the rising edge of the signal SETTRIMVREF, the levels of the reference voltage VREF and the internal voltage VINT are raised by a respective specific value or a respective specific ratio.

In addition, although the initial control section 14 outputs the signal INITFRD* to one or more fuses 17, the signal SETTRIMVREF is valid (high level) as an example for illustration. The initial control section 14 can also be at the timing when the first setting information is determined to be valid by the determination unit 16, so that the signal SETTRIMVREF is valid (high level).

In addition, the determination unit 16 can also output an invalid (low level) signal ERRINITFRD when the count value of the counter 13*a* of the internal voltage detection unit 13 reaches the maximum value (the signal VINTONSEL-MAX is valid (high level)). In this case, the determination unit 16 determines that the first setting information read last in the repeated reading is valid.

In this embodiment, it is illustrated that the reading condition is changed by increasing the voltage of the signal INITFRDVREF for reading the first setting information every time that the first setting information is determined to be invalid. In other embodiments, every time that the first setting information is determined to be invalid, the reading condition of the first initial setting information can also be changed by extending the read time for the first setting information. For example, every time that the first setting information is determined to be invalid, the delay time in the delay circuit 14*a* of the initial control unit 14 may be controlled to extend the pulse width of the signal INITFRDVREF, thereby extending the duration of the first setting information.

In addition, in this embodiment, although the non-volatile memory units 15*a*, 15*b* are respectively configured to store 1-bit first setting information as an example for description. In other embodiments, when the first setting information is configured as a plurality of bits, the two non-volatile memory units 15*a*, 15*b* may also be configured to respectively store the plurality of bits of the first setting information. In another embodiment, when the first setting information is configured as a plurality of bits, a set of non-volatile memory units 15*a*, 15*b* can also be provided for each of the plurality of bits of the first setting information, the validity of each of a plurality of bits may be determined in the determination unit 16. Therefore, the validity of the first setting information can be improved.

As mentioned above, according to the initial setting device of this embodiment, the reading of the first setting information will be repeated until the first setting information is determined to be valid. Therefore, the initial setting of the semiconductor memory can be performed based on the valid setting information.

In addition, considering the manufacturing variation or operating temperature variation of the non-volatile memory device, in the conventional initial setting device, the conditions for correctly reading the setting information from the non-volatile memory device (for example: the voltage level of the power supply voltage or read time, etc.) are limited within a narrow range. However, according to the initial setting device of this embodiment, even if the reading condition of the first setting information is outside the above-mentioned range, the valid first setting information can be obtained as long as the first setting information read from the fuse 15 is determined to be valid. Therefore, compared with the traditional initial setting device, the range for correctly reading the first setting information can be expanded, and the design freedom of the initial setting device can be improved.

The second embodiment of the present invention will be described below. The initial setting device of this embodiment determines whether the first setting information is valid or not by comparing the first setting information read multiple times from the fuse 15 during one reading of the first setting information, which is different from the first embodiment. Hereinafter, configurations different from those of the first embodiment will be described.

In this embodiment, the fuse 15 includes a non-volatile memory unit 15*a* for storing the first setting information. In addition, in this embodiment, the determination unit 16 determines whether the first setting information is valid by comparing the first setting information read multiple times from the non-volatile memory unit 15*a* during one reading of the first setting information.

In addition, in the present embodiment, when the bit value representing the first setting information is stored in the non-volatile memory unit 15*a*, the determination unit 16 determines that the first setting information is valid by reading the first setting information multiple times from the non-volatile memory unit 15*a* that are the same. Therefore, the validity of the first setting information can be determined more easily.

Figure 4:
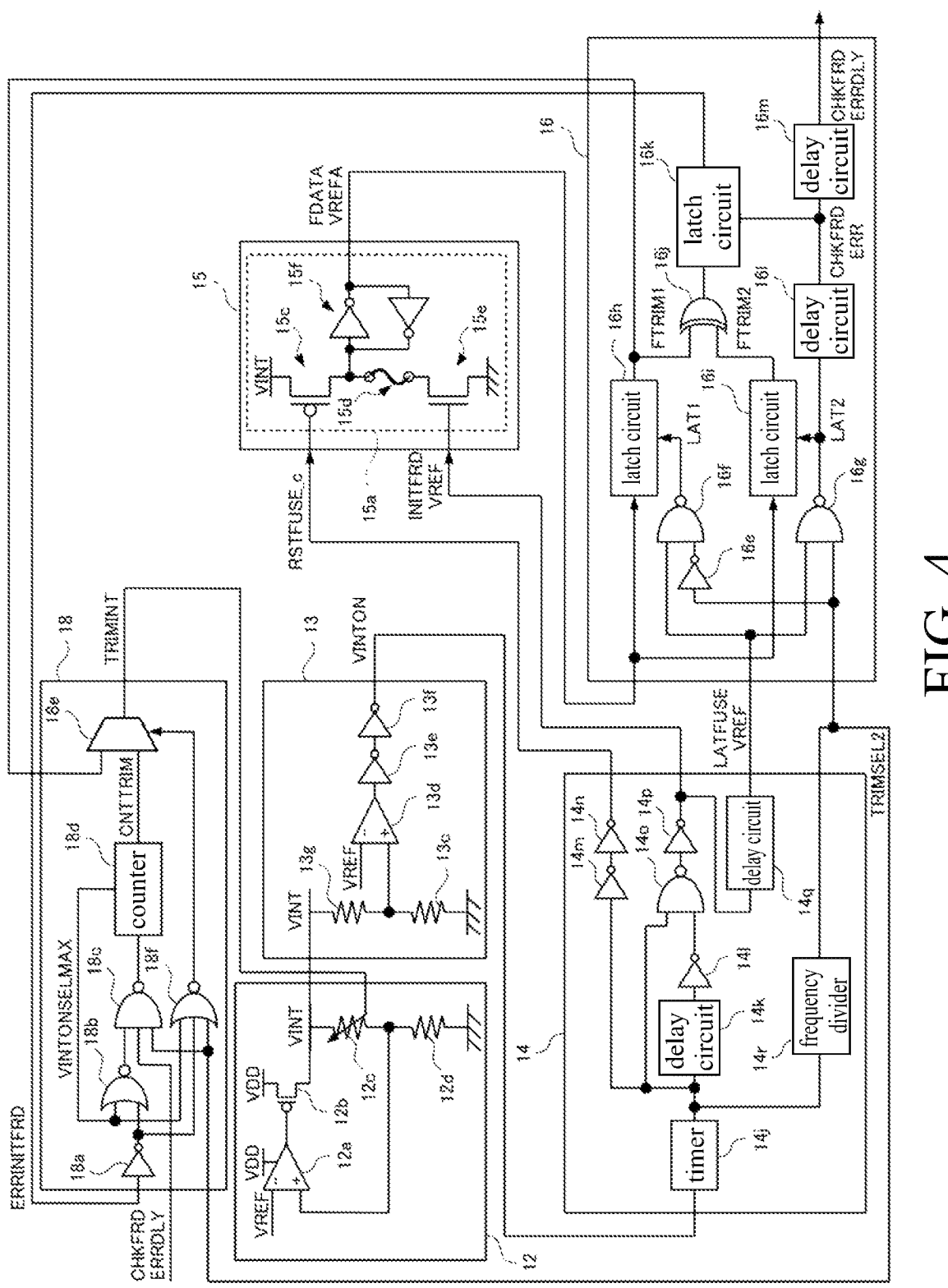
FIG. 4 is a schematic diagram of a detailed configuration example of each part of the initial setting device in accordance with the second embodiment of the present invention.

FIG. 4 illustrates an example of the configuration of the initial setting device in accordance with the second embodiment of the present invention. Referring to FIG. 4, the initial setting device includes a reference voltage generation unit 11 (omitted in FIG. 4), an internal voltage generation unit 12, an internal voltage detection unit 13, an initial control unit 14, a fuse 15, unit 16, one or more fuses 17 (omitted in FIG. 4), and an internal voltage control unit 18.

In the present embodiment, the internal voltage generation unit 12 includes a comparator 12*a*, a MOSFET 12*b*, a variable resistor 12*c*, and a resistor 12*d*.

The "−" terminal of the comparator 12*a* is supplied with the reference voltage VREF generated by the reference voltage generation unit 11. In addition, the "+" terminal of the comparator 12*a* is connected to the connection node between the variable resistor 12*c* and the resistor 12*d*. Furthermore, the output terminal of the comparator 12*a* is connected to the gate of the MOSFET 12*b*.

The source of the MOSFET 12*b* is connected to the external supply voltage VDD. In addition, the drain of MOSFET 12*b* is connected to internal voltage VINT. In this embodiment, MOSFET 12*b* is P-type.

The variable resistor 12*c* and the resistor 12*d* are connected in series between the internal voltage VINT and the ground. The variable resistor 12*c* is configured to change the resistance value according to the value of the signal TRIMINT output from the internal voltage control unit 18. For example, the resistance value of the variable resistor 12*c* increases as the value of the signal TRIMINT increases.

Referring to FIG. 4 again, the internal voltage detection unit 13 includes a resistor 13*c*, a comparator 13*d*, inverters 13*e* and 13*f*, and a resistor 13*g*. Here, the configurations of the resistor 13*c*, the comparator 13*d*, and the inverters 13*e* and 13*f* are the same as those of the first embodiment.

The resistor 13*g* is provided to replace the variable resistor 13*b* of the internal voltage detection portion 13 in the first embodiment. That is, the resistor 13*g* and the resistor 13*c* are connected in series between the internal supply voltage VINT and the ground, and the connection node between the resistor 13*g* and the resistor 13*c* is connected to the "+" terminal of the comparator 13*d*.

Referring to the FIG. 4 again, the initial control unit 14 includes a timer 14*j*, a delay circuit 14*k*, inverters 14*l*, 14*m*, 14*n*, a NAND circuit 14*o*, an inverter 14*p*, a delay circuit 14*q*, and a frequency divider 14*r*.

The timer 14*j* is configured to input the trigger signal VINTON, and when the trigger signal VINTON is valid (high level), a pulse signal having the same level as the trigger signal VINTON is output to the delay circuit 14*k*, the inverter 14*m*, the NAND circuit 140, and the frequency divider 14*r* every a predetermined period.

The delay circuit 14*k* delays the signal input from the timer 14*j* for a specific time, and outputs the delayed signal to the inverter 14*l*. The inverter 14*l* inverts the signal input from the delay circuit 14*k*, and outputs the logic inverted signal to the NAND circuit 140.

The inverter 14*m* inverts the signal input from the timer 14*j*, and outputs the logic inverted signal to the inverter 14*n*. The inverter 14*n* inverts the signal input from the inverter 14*m*, and outputs the logic inverted signal to the fuse 15 as the signal RSTFUSE_c for resetting the fuse 15.

The signal output from the timer 14*j* is input to one input terminal of the NAND circuit 140. In addition, the signal output from the inverter 14*l* is input to the other input terminal of the NAND circuit 140. The NAND circuit 140 performs NAND operation based on the input signals, and outputs the signal of the operation result to the inverter 14*p*.

The inverter 14*p* inverts the logic of the signal input from the NAND circuit 140, and outputs the logic inverted signal as a signal INITFRDVREF to the delay circuit 14*q* and the fuse 15. Here, the inverter 14*p* outputs a high pulse for resetting the fuse 15 as a signal INITFRDVREF according to the rising edge of the signal output from the timer 14*j*.

The delay circuit 14*q* delays the signal INITFRDVREF input from the inverter 14*p* by a predetermined period, and outputs the delayed signal as a signal LATFUSEVREF to the determination unit 16 for latching the information read from the fuse 15.

The frequency divider 14*r* divides (for example: divides by 2) the signal output from the timer 14*j*, and outputs the divided signal as a signal TRIMSEL2 to the determination unit 16 and the internal voltage control unit 18.

Referring to FIG. 4 again, the fuse 15 includes a non-volatile memory unit 15*a*. The configuration of the non-volatile memory unit 15*a* is the same as that of the first embodiment. In this embodiment, the fuse resistor 15*d* of the non-volatile memory unit 15*a* in the connected state is illustrated, but the non-volatile memory portion 15*a* may also have a fuse resistor 15*d* in the cut-off state.

Referring to FIG. 4 again, the determination unit 16 includes an inverter 16*e*, NAND circuits 16*f* and 16*g*, latch circuits 16*h* and 16*i*, an EXOR circuit 16*j*, a latch circuit 16*k*, and delay circuits 16*l* and 16*m*.

The inverter 16*e* inverts the signal TRIMSEL2 input from the start control unit 14, and outputs the logic inverted signal to the NAND circuit 16*f*.

The signal LATFUSEVREF output from the initial control unit 14 is input to one input terminal of the NAND circuit 16*f*. In addition, the signal output from the inverter 16*e* is input to the other input terminal of the NAND circuit 16*f*. The NAND circuit 16*f* performs a NAND operation based on the input signals, and outputs a signal as the operation result to the latch circuit 16*h*.

The signal LATFUSEVREF output from the initial control unit 14 is input to one input terminal of the NAND circuit 16*g*. In addition, the signal TRIMSEL2 output from the start control unit 14 is input to the other input terminal of the NAND circuit 16*g*. The NAND circuit 16*g* performs a NAND operation based on the input signals, and outputs a signal LAT2 as the operation result to the latch circuit 16*i* and the delay circuit 16*l*.

The latch circuit 16*h* is configured to input the signal FDATAVREFA output from the fuse 15. In addition, the latch circuit 16*h* latches the signal FDATAVREFA when the invalid (low level) signal LAT1 is input. Furthermore, the latch circuit 16*h* outputs the signal FTRIM1 indicating the value of the latched signal FDATAVREFA to the EXOR circuit 16*j* and the internal voltage control unit 18.

The latch circuit 16*i* is configured to input the signal FDATAVREFA output from the fuse 15. In addition, the latch circuit 16*i* latches the signal FDATAVREFA when the invalid (low level) signal LAT2 is input. Furthermore, the latch circuit 16*i* outputs the signal FTRIM2 indicating the value of the latched signal FDATAVREFA to the EXOR circuit 16*j*.

The signal FTRIM1 output from the latch circuit 16*h* is input to one input terminal of the EXOR circuit 16*j*. In addition, the signal FTRIM2 output from the latch circuit 16*i* is input to the other input terminal of the EXOR circuit 16*j*. The EXOR circuit 16*j* performs EXOR calculation based on the input signals, and outputs the signal as the calculation result to the latch circuit 16*k*.

The latch circuit 16*k* latches the signal output from the EXOR circuit 16*j*, and outputs the latched signal as a signal ERRINITFRD to the internal voltage control unit 18 when the valid (high level) signal CHKFRDERR is input from the delay circuit 16*l*.

The delay circuit 16*l* delays the signal LAT2 input from the NAND circuit for a certain period, and outputs the delayed signal as a signal CHKFRDERR to the latch circuit 16*k* and the delay circuit 16*m*. The delay circuit 16*m* delays the signal input from the delay circuit 16*l* for a predetermined period, and outputs the delayed signal to the internal voltage control unit 18 as a signal CHKFRDERRDLY.

Referring to FIG. 4 again, the internal voltage control unit 18 includes an inverter 18*a*, a NOR circuit 18*b*, a NAND circuit 18*c*, a counter 18*d*, a selector 18*e*, and a NOR circuit 18*f*.

The inverter 18*a* inverts the logic of the signal ERRIN-ITFRD input from the determination unit 16, and outputs the signal of the logic inversion to the NOR circuit 18*b*.

The signal VINTONSELMAX output from the counter 18*d* is input to one input terminal of the NOR circuit 18*b*. In addition, the signal output from the inverter 18*a* is input to the other input terminal of the NOR circuit 18*b*. The NOR circuit 18*b* performs NOR calculation based on the input signals, and outputs a signal as the calculation result to the NAND circuit 18*c*.

The signal output from the inverter 18*a* is input to the first input terminal of the NAND circuit 18*c*. In addition, the signal CHKFRDERRDLY output from the determination unit 16 is input to the second input terminal of the NAND circuit 18*c*. Furthermore, the signal TRIMSEL2 output from the start control unit 14 is input to the third input terminal of the NAND circuit 18*c*. The NAND circuit 18*c* performs a NAND operation based on the input signals, and outputs a signal as a result of the operation to the counter 18*d*.

For example, when the signal ERRINITFRD is at a high level (that is, a setting information is determined to be invalid) and the signal TRIMSEL2 is at a high level, the counter 18*d* increments the count value by 1 every time that the invalid (low level) signal is input from the NAND circuit 18*c*. In addition, the counter 18*d* outputs a signal CNTTRIM indicating a count value to the selector 18*e*. Furthermore, when the count value reaches the maximum value, the counter 18*d* makes the signal VINTONSELMAX indicating that the count value has reached the maximum value valid (high level) and outputs the signal VINTONSELMAX to the NOR circuit 18*b*. Here, the counter 18*d* may reset the count value to an initial value (e.g., 0) when the count value reaches the maximum value. Furthermore, the counter 18*d* may also reset the count value to an initial value when power is input to the semiconductor memory, or when the power input to the semiconductor memory device is blocked.

The signal FTRIM1 output from the discrimination unit 16 is input to one input terminal of the selector 18*e*. In addition, the signal CNTTRIM output from the counter 18*d* is input to the other input terminal of the selector 18*e*. Furthermore, the signal output from the NOR circuit 18*f* is input to the selector 18*e* as a control signal. Here, when a valid (high level) signal is input from the NOR circuit 18*f*, the selector 18*e* outputs a signal indicating the value of the signal CNTTRIM to the internal voltage generation unit 12 as a signal TRIMINT. In addition, when an invalid (low level) signal is input from the NOR circuit 18*f*, the selector 18*e* outputs a signal indicating the value of the signal FTRIM1 to the internal voltage generation unit 12 as a signal TRIMINT.

The signal output from the inverter 18*a* is input to the first input terminal of the NOR circuit 18*f*. In addition, the signal VINTONSELMAX output from the counter 18*d* is input to the second input terminal of the NOR circuit 18*f*. Furthermore, the signal TRIMSEL2 output from the start control unit 14 is input to the third input terminal of the NOR circuit 18*f*. The NOR circuit 18*f* performs NOR calculation based on the input signal, and outputs the signal as the calculation result to the selector 18*e*. Here, the NOR circuit 18*f* outputs an invalid (low level) signal to the selector 18*e* when a high-level signal is input to any one of the input terminals. In this case, the selector 18*e* outputs a signal indicating the value of the signal FTRIM1 to the internal voltage generation unit 12 as a signal TRIMINT. In addition, the NOR circuit 18*f* outputs a valid (high level) signal to the selector 18*e* when all input terminals are input with low level signals. In this case, the selector 18*e* outputs a signal indicating the value of the signal CNTTRIM to the internal voltage generation unit 12 as the signal TRIMINT.

Figure 5:
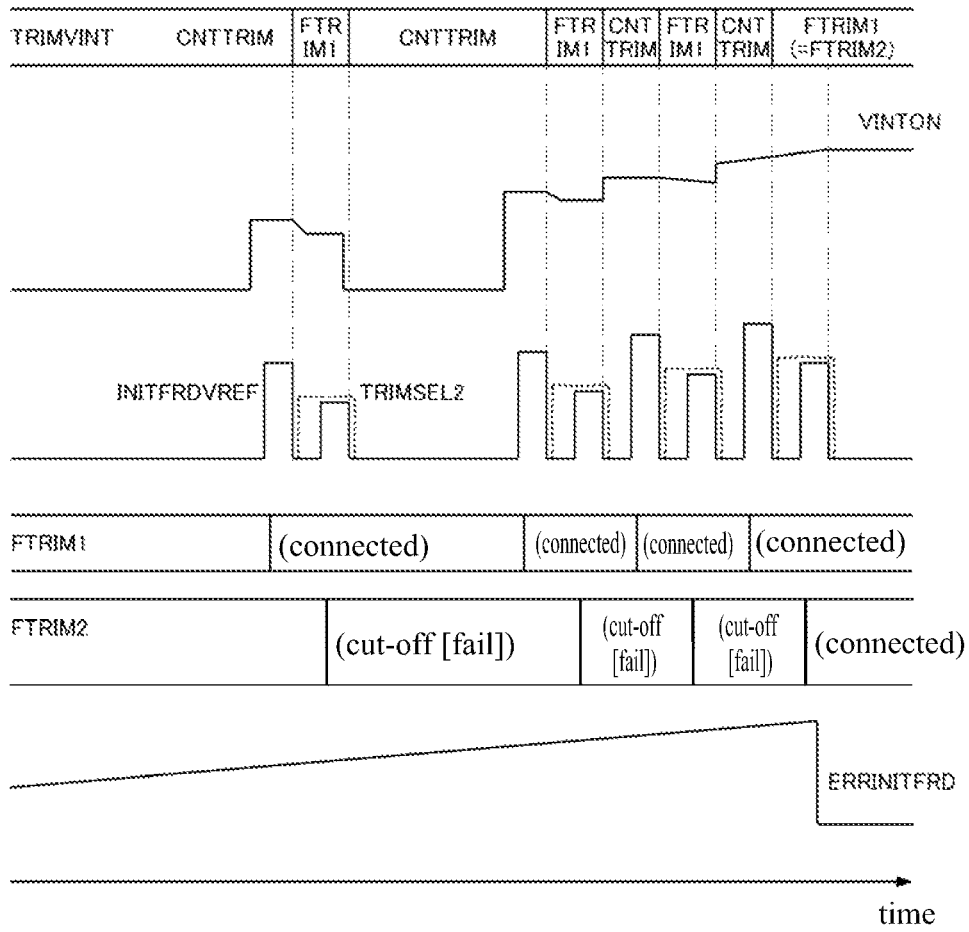

FIG. 5 is a timing diagram showing the timing of signals in the initial setting device in accordance with the second embodiment of the present invention. In this embodiment, when the initial setting device reads the first setting information of the fuse 15, the signal CNTTRIM is selected as the signal TRIMVINT to perform the first read on the fuse 15, and the signal FTRIM1 is selected as the signal TRIMVINT for performing a second read on the fuse 15.

When the fuse 15 is read for the first time (that is, when the signal CNTTRIM is selected as the signal TRIMVINT), the internal voltage VINT of the fuse 15 is read not based on the state of the first setting information stored in the fuse 15.

When the fuse 15 is read for the second time (that is, when the signal FTRIM1 is selected as the signal TRIMVINT), the internal voltage VINT is adjusted based on the first setting information read from the fuse 15 in the first read to read the fuse 15. Here, it is assumed that the first setting information is set to the level of the internal voltage VINT that is lowered by a specific value or by a specific ratio due to the influence of manufacturing variation and the like. In this case, the second reading of the fuse 15 is performed with the level of the internal voltage VINT lower than the first reading by a specific value or a specific ratio.

Then, when the first setting information read twice by the initial setting device is the same, it is determined that the first setting information is valid; and when the first setting information read twice is different, it is determined that the first setting information is invalid. When the initial setting device of this embodiment determines that the first setting information is invalid, the above-mentioned twice reading and determination will be repeated until it determines that the first setting information is valid.

Referring to FIG. 4 and FIG. 5 at the same time. First, when the external voltage is input to the semiconductor memory, the reference voltage generation unit 11 generates the reference voltage VREF based on the of the external voltage VDD.

In addition, when the external voltage is input to the semiconductor memory, the signal ERRINITFRD, the signal CHKFRDERR, and the signal VINTONSELMAX are at the low level. In this case, the counter 18*d* of the internal voltage control unit 18 is initialized to an initial value (e.g., 0). The selector 18*e* of the internal voltage control unit 18 outputs a signal indicating the value of the signal CNTTRIM to the internal voltage generation unit 12 as a signal TRIMINT by inputting a valid (high level) signal from the NOR circuit 18*f*.

The internal voltage generation unit 12 changes the resistance value of the variable resistor 12*c* according to the value of the signal CNTTRIM input from the internal voltage control unit 18. When the level of the internal voltage VINT is lower than the level of the reference voltage VREF, the MOSFET 12*b* is turned on. Therefore, the internal voltage VINT is charged by the external voltage VDD. In addition, the level of the internal voltage VINT output from the internal voltage generation unit 12 changes according to the change of the resistance value of the variable resistor 12*c*. For example, the level of the internal voltage VINT increases as the resistance value of the variable resistor 12*c* increases.

Similar to the above-mentioned first embodiment, when the level of the internal voltage VINT reaches a specific target level exceeding the level of the reference voltage VREF, the trigger signal VINTON becomes high level by the signal output from the comparator 13*d* of the internal voltage detection unit 13 being at the high level. Therefore, the first reading on the fuse 15 is performed with signal CNTTRIM selected as the signal TRIMVINT.

When the initial control unit 14 receives the high-level trigger signal VINTON, it first outputs the invalid (low-level) signal RSTFUSE_c to the fuse 15. In this case, the P-type MOSFET 15*c* of the nonvolatile memory unit 15*a* of the fuse 15 is turned on. On the other hand, the N-type MOSFET 15*e* of the non-volatile memory unit 15*a* of the fuse 15 is turned off because the signal INITFRDVREF is at a low level. Therefore, the signal FDATAVREFA output from the non-volatile memory portion 15*a* of the fuse 15 becomes at the low level.

Next, when the signal output by the timer 14*j* becomes a high level, the initial control unit 14 outputs a valid (high level) signal RSTFUSE_c, and outputs the signal INITFRDVREF being valid (high level) to the fuse 15. Here, it is assumed that when the fuse 15 is read for the first time (that is, when the signal CNTTRIM is selected as the signal TRIMVINT), even in the initial state of the counter 18*d* of the internal voltage control unit 18 (that is, the value of the signal CNTTRIM is in the state of the initial value), the level of the internal voltage VINT generated in the internal voltage generating unit 12 is also sufficiently high. At this time, the levels of the trigger signal VINTON and the signal INITFRDVREF are high enough to reverse the bit state of the latch circuit 15*f* in the non-volatile memory portion 15*a* of the fuse 15. Therefore, the non-volatile memory unit 15*a* of the fuse 15 outputs the signal FDATAVREFA to be at a high level by sufficiently lowering the level of the latch circuit 15*f*.

In addition, the initial control unit 14 outputs the valid (high level) signal LATFUSEVREF to the determination unit 16 after a certain period elapses from the output of the signal INITFRDVREF being valid (high level). Furthermore, the initial control unit 14 outputs the invalid (low level) signal TRIMSEL2 to the determination unit 16 and the internal voltage control unit 18.

In this case, since the signal LAT1 becomes low level and the signal LAT2 becomes high level, the determination unit 16 latches the signal FDATAVREFA output from the fuse 15 in the latch circuit 16*h*. In addition, the latch circuit 16*h* outputs the signal FTRIM1 indicating the value of the latched signal FDATAVREFA to the EXOR circuit 16*j*. In addition, in the example of FIG. 5, the value of the signal FTRIM1 is indicated as (connected), which is the case where the bit value of the first setting information is 1 (that is, the signal FDATAVREFA is at a high level), and it is determined that the fuse resistor 15*d* of the non-volatile memory unit 15*a* is in the connected state.

Next, the initial control unit 14 outputs the effective (high level) signal TIRMSEL2 to the determination unit 16 and the internal voltage control unit 18. In this case, the selector 18*e* of the internal voltage control unit 18 outputs a signal indicating the value of the signal FTRIM1 as a signal TRIMINT to the internal voltage generating unit 12 by inputting an invalid (low level) signal from the NOR circuit 18*f*.

In the internal voltage generation unit 12, the resistance value of the variable resistor 12*c* is changed according to the value of the signal TRIMINT input from the internal voltage control unit 18. In addition, as mentioned above, in this embodiment, it is assumed that when the signal FTRIM1 is selected as the signal TRIMINT, the level of the internal voltage VINT is adjusted to drop by a specific value or a specific ratio based on the first setting information read in the first time. Therefore, the value of the signal FTRIM1 is set to a value less than the value of the signal CNTTRIM. Therefore, compared with the case where the signal CNTTRIM is selected as the signal TRIMINT, the level of the internal voltage VINT output from the internal voltage generation unit 12 is lowered by a specific value or a specific ratio.

In addition, because the level of the internal voltage VINT changes, the trigger signal VINTON temporarily becomes low level. Afterwards, the level of the internal voltage VINT rises. When the internal voltage VINT rises higher than the reference voltage VREF, the comparator 13*d* outputs a high-level signal, and the trigger signal VINTON becomes high-level. Therefore, the fuse 15 is read for a second time with the signal FTRIM1 selected as the signal TRIMINT. In addition, as described above, when the second reading of the fuse 15 (that is, when the signal FTRIM1 is selected as the signal TIMINT) is compared with the first reading (that is, when the signal CNTTRIM is selected as the signal TRIMINT), the level of the internal voltage VINT becomes lower. Therefore, as shown in FIG. 5, the voltage level of the trigger signal VINTON is lower in the second reading of the first setting information than that in the first reading.

Similar to the first reading, the initial control unit 14 outputs an invalid (low level) signal RSTFUSE_c, and outputs a valid (high level) signal INITFRDVREF to the fuse 15 after a certain period of time. Here, when the voltage level of the signal INITFRDVREF is low, the voltage level of the latch circuit 15*f* of the non-volatile memory unit 15*a* cannot be sufficiently lowered, and as a result, the low-level signal FDATAVREFA is output from the non-volatile memory unit 15*a*.

In addition, the initial control unit 14 outputs the valid (high level) signal LATFUSEVREF to the determination unit 16 after a certain time elapses from the output of the valid (high level) signal INITFRDVREF. Furthermore, the signal TRIMSEL2 is in a valid (high level) state.

In this case, since the signal LAT1 becomes a high level and the signal LAT2 becomes a low level, the determination unit 16 latches the signal FDATAVREFA output from the fuse 15 in the latch circuit 16*i*. In addition, the latch circuit 16*i* outputs the signal FTRIM2 indicating the value of the latched signal FDATAVREFA to the EXOR circuit 16*j*. In addition, in the example in FIG. 5, the value of the signal FTRIM2 is indicated as (cut-off), which means that it is determined that the fuse resistor 15*d* of the non-volatile memory unit 15*a* is in the cut-off state when the bit value of the first setting information is 0 (that is, the signal FDATAVREFA is at a low level).

At this time, the EXOR circuit 16*j* of the determination unit 16 outputs a valid (high level) signal to the latch circuit 16*k*. In addition, when the valid (high level) signal CHKFRDERR is input from the delay circuit 16*l*, the latch circuit 16*k* outputs the valid (high level) signal ERRIN- ITFRD (in this case, indicating that the first setting information is invalid) to the internal voltage control unit 18. Accordingly, the determination unit 16 determines that the first setting information is invalid when the first setting information read for the first time is different from the first setting information read for the second time.

In addition, the counter 18d of the internal voltage control unit 18 increases the count value by 1 by inputting the valid (high level) signal ERRINITFRD. In addition, the selector 18e of the internal voltage control unit 18 outputs a signal indicating the value of the signal CNTTRIM as a signal TRIMINT to the internal voltage generating unit 12 by inputting an active (high level) signal from the NOR circuit 18f. The internal voltage generation unit 12 increases the target level of the internal voltage VINT according to the value of the signal TRIMINT. Then, when the level of the internal voltage VINT reaches a specific target level, the trigger signal VINTON becomes a high level by outputting a high-level signal from the comparator 13d of the internal voltage detection unit 13. Subsequent operations are the same as those described above.

In this way, the first reading of the fuse 15 is performed again under the condition that the signal CNTTRIM is selected as the signal TRIMVINT, and the second reading of the fuse 15 is performed under the condition that the signal FTRIM1 is selected as the signal TRIMVINT.

As mentioned above, in this embodiment, the target level of the internal voltage VINT is repeatedly raised each time the first setting information is determined to be invalid. When the level of the internal voltage VINT is raised, the voltage levels of the trigger signal VINTON and the signal INITFRDVREF also increase based on the level of the internal voltage VINT. Next, when the signal INITFRDVREF reaches a specific voltage level, in both the first reading and the second reading, the non-volatile memory unit 15a outputs a high-level signal FDATAVREFA indicating that the bit value of the first setting information is 1. In this case, the determination unit outputs a valid (high level) signal ERRINITFRD (that is, indicating the first setting information valid). In other words, the determination unit 16 determines that the first configuration information is valid when the first configuration information read twice are the same.

In addition, in this embodiment, when the first setting information is determined to be invalid and the trigger signal VINTON is valid (high level), the timer 14j of the initial control unit 14 performs the second read on the fuse 15 again by outputting the pulse signal every the predetermined period. In this case, by extending the interval between the pulses output from the timer 14j (extending the delay time in the timer 14j), the voltage level of the signal INITFRDVREF can be surely raised to a specific target level.

In addition, in this embodiment, it is illustrated that the reading of the first setting information is changed by increasing the voltage of the signal INITFRDVREF for reading the first setting information every time the first setting information is determined to be invalid. In other embodiments, each time the first setting information is determined to be invalid, the reading condition of the first setting information can also be changed by extending the read time of the first setting information. For example, every time the first setting information is determined to be invalid, the delay time in the delay circuit 14k of the initial control unit 14 can be controlled to extend the pulse width of the signal INITFRDVREF, thereby extending the duration of the first setting information.

In addition, in this embodiment, although the non-volatile memory unit 15a is configured as 1-bit first setting information as an example for description. In other embodiments, when the first setting information is configured as a plurality of bits, the non-volatile memory unit 15a may also be configured to store the plurality of bits of the first setting information. In addition, when the first setting information is configured as a plurality of bits, a non-volatile memory unit 15a may be provided for each of the plurality of bits of the first setting information, and the validity of each bit may be discriminated in the determination unit 16. Thereby, the validity of the first setting information can be improved.

As mentioned above, according to the initial setting device of this embodiment, by comparing whether the first setting information read twice from a non-volatile memory portion 15a are the same, it is possible to easily determine whether the first setting information is valid.

The embodiments described above are described for the purpose of making the present invention easy to understand, and are not intended to limit the present invention. Therefore, the components disclosed in the above-mentioned embodiments are intended to include all design changes or equivalents within the technical scope of the present invention. In addition, the configurations of units 11-18 shown in FIG. 2 and/or FIG. 4 is only an example, and it can change suitably, or adopt a well-known structure or various structures.

For example, in the above-mentioned embodiments, although the initial setting device is set in the DRAM as an example for illustration, the present invention is not limited thereto. The initial setting device can also be set in other semiconductor memories such as Static Random Access Memory (SRAM) or flash memory.

In addition, in the above-mentioned embodiments, although the first non-volatile memory device and the second non-volatile memory device are respectively constituted by fuses for illustration, the present invention is not limited thereto. For example, the first non-volatile memory device and the second non-volatile memory device may also be composed of OTPROM or other non-volatile memory devices other than fuses.

Furthermore, in the first embodiment, although the bit value read from the non-volatile memory portion 15a by the discriminating portion 16 is different from the bit value read from the non-volatile memory portion 15b, determining that the first setting information is valid is described as an example, but the present invention is not limited thereto. For example, the determination unit 16 may also be configured in a situation that a group of non-volatile memory units 15a, 15b respectively store the same bit value. When the bit value read from the non-volatile memory unit 15a is the same as the bit value read from the non-volatile memory unit 15b, it is determined that the first setting information is valid.

In addition, in the first embodiment, although it is illustrated that the fuse 15 includes two non-volatile memory units 15a, 15b, and that the determination unit 16 determines whether the first setting information is valid or not by comparing information read from the two non-volatile memory units 15a, 15b respectively, but the present invention is not limited thereto. For example, the fuse 15 may also include three or more non-volatile memory units, and the determination unit 16 determines whether the first setting information is valid.

Also, in the second embodiment, although it is illustrated that the determination unit 16 determines whether the first setting information is valid or not by comparing the first setting information read twice from the fuse 15 during one reading of the first setting information, but the present invention is not limited thereto. For example, the determination unit 16 may also determine whether the first setting information is valid by comparing the first setting information read three times or more from the fuse 15 during one reading of the first setting information.

Moreover, in the first embodiment, although it is illustrated that the reference voltage VREF is adjusted based on the first setting information, the present invention may also adjust the internal voltage VINT based on the first setting information. In addition, in the second embodiment, although it is illustrated that the adjustment of the internal voltage VINT based on the first setting information, the reference voltage VREF may also be adjusted based on the first setting information.

Also, in the second embodiment, although it is illustrated that the first setting information is set to lower the level of the unadjusted internal voltage VINT by a specific value or a specific ratio, the first setting information can also be set to increase the level of the unadjusted internal voltage VINT by a specific value or a specific ratio.

In addition, in the above-mentioned embodiments, although it is illustrated that the sources of the P-type MOSFETs 15c of the non-volatile memory units 15a and 15b are connected to the internal voltage VINT, for example, the sources of the P-type MOSFETs 15c can also be connected to the external voltage VDD. Here, in an embodiment using an external voltage as the power supply of the fuse, the initial setting device may also include an external voltage detection unit (omitted in Figures) that detects the voltage VDD of the external voltage as a replacement of the internal voltage detection unit. The external voltage detection unit can also be configured to output a valid (high level) trigger signal VINTON according to the level of the external voltage VDD.

What is claimed is:

1. An initial setting device of a semiconductor memory device, comprising:
   a voltage detection unit, detecting a voltage of a power supply;
   a first non-volatile memory device, comprising a non-volatile memory unit storing first setting information for setting an operation condition of the semiconductor memory;
   a control unit, reading the first setting information of the first non-volatile memory device based on a voltage level of the detected voltage of the power supply;
   a determination unit, determining whether the first setting information is valid;
   wherein the determination unit is configured to determine whether the first setting information is valid by comparing the first setting information read by a first time reading and a second time reading from the non-volatile memory unit;
   wherein the determination unit determines that the first setting information is invalid when the first setting information read by the first time reading and the second time reading are different;
   wherein when the first setting information is determined to be invalid, following steps are repeatedly performed until the first setting information is determined to be valid:
   a first step, in which the control unit is configured to change a reading condition of the first setting information and read the first setting information for the first time reading and the second time reading;

a second step, in which the determination unit is configured to determine whether the first setting information is valid by comparing the first setting information read by the first time reading and the second time reading from the non-volatile memory unit in the first step.

2. The initial setting device as defined in claim 1, wherein the control unit changes the reading condition of the first setting information by raising a voltage of a signal for reading the first setting information every time the first setting information is determined to be invalid.

3. The initial setting device as defined in claim 1, wherein the control unit changes the reading condition of the first setting information by extending a read time for reading the first setting information every time the first setting information is determined to be invalid.

4. The initial setting device as defined in claim 1, wherein the determination unit determines that the first setting information is valid when the first setting information read by the first time reading and the second time reading are the same.

5. The initial setting device as defined in claim 1, wherein the non-volatile memory unit comprises fuse ROMs.

6. The initial setting device as defined in claim 1, wherein the initial control unit reads second setting information from a second non-volatile memory device storing the second setting information that is different from the first setting information when the first setting information is determined to be valid.

7. The initial setting device as defined in claim 1, wherein the first setting information comprises information for adjusting the voltage of the power supply;
   wherein the initial setting device further comprises:
   a voltage generation unit, generating the voltage of the power supply based on the information for adjusting the voltage of the power supply.

8. The initial setting device as defined in claim 7, wherein the voltage generation unit comprises:
   a reference voltage generation unit, receiving an external power supply to generate a reference voltage; and
   an internal voltage generation unit, generating the voltage of the power supply based on the external power supply and the reference voltage.

9. The initial setting device as defined in claim 8, wherein the reference voltage generation unit generates the reference voltage based on the first setting information.

10. The initial setting device as defined in claim 9, wherein the voltage of the power supply exceeds the reference voltage.

11. The initial setting device as defined in claim 8, wherein the internal voltage generation unit comprises:
   a first comparator, comparing a voltage of a first node with the reference voltage to generate a first signal;
   a MOSFET, comprising a gate, a source, and a drain, wherein the gate receives the first signal, the source is connected to the external supply voltage, and the drain is connected to the power supply;
   a variable resistor, connected between the power supply and the first node, wherein a resistance value of the variable resistor is changed according to a value of a second signal; and
   a first resistor, connected between the first node and a ground.

12. The initial setting device as defined in claim 11, wherein the voltage detection unit comprises:
   a second resistor, connected between a second node and the ground;

a second comparator, comparing a voltage of the second node to the reference voltage to generate a second signal;

a plurality of first inverters, buffering the second signal to generate a trigger signal; and a third resistor, connected between the power supply and the second node.

13. The initial setting device as defined in claim 12, wherein the control unit comprises:

a timer, configured to input the trigger signal and output a timing signal, wherein when the trigger signal is valid, a pulse signal having the same level as the trigger signal is output every a predetermined period as the timing signal;

a first delay circuit, delaying the timing signal for a specific time and outputting a first delayed signal;

a second inverter, inverting the first delayed signal and outputting a first inverted signal;

a third inverter, inverting the timing signal and outputting a second inverted signal;

a fourth inverter, inverting the second inverted signal and outputting a third inverted signal to the first non-volatile memory device;

a first NAND circuit, performing NAND calculation on the timing signal and the first inverted signal to output a first calculation result;

a fifth inverter, inverting the first calculation result and outputting a fourth inverted signal to the first non-volatile memory device;

a second delay circuit, delaying the fourth inverted signal by a predetermined period to output a second delay signal to the determination unit for latching the first setting information read from the first non-volatile memory device; and a frequency divider, dividing the timing signal and outputting a divided signal to the determination unit.

14. The initial setting device as defined in claim 13, wherein the determination unit comprises:

a sixth inverter, inverting the divided signal to output a fifth inverted signal;

a second NAND circuit, performing the NAND calculation on the second delay signal and the fifth inverted signal to generate a second calculation result;

a third NAND circuit, performing the NAND calculation on the second delay signal and the divided signal to generate a third calculation result;

a first latch circuit, latching the first setting information read from the first non-volatile memory device to generate a first latch signal when the second calculation result is invalid;

a second latch circuit, latching the first setting information read from the first non-volatile memory device to generate a second latch signal when the third calculation result is invalid;

an EXOR circuit, performing EXOR calculation on the first latch signal and the second latch signal to generate a fourth calculation result;

a third delay circuit, delaying the third calculation result for a first period to generate a third delay signal;

a fourth delay circuit, delaying the third delay signal for a second period to generate a fourth delay signal; and a third latch circuit, latching the fourth calculation result to output a third latch signal.

15. The initial setting device as defined in claim 14, further comprising:

an internal voltage control unit, comprising:

a seventh inverter, inverting the third latch signal to generate a sixth inverted signal;

a first NOR circuit, performing a NOR calculation on a max signal and the sixth inverted signal to generate a fifth calculation result;

a third NAND circuit, performing the NAND calculation on the fourth delay signal, the divided signal, and the fifth calculation result to generate a sixth calculation result;

a counter, incrementing the count value by 1 every time that the fifth calculation result is invalid, outputting a counting signal indicating the count value, and outputting the max signal indicating that the count value has reached the maximum value valid;

a second NOR circuit, performing the NOR calculation on the sixth inverted signal, the max signal, and the divided signal to generate a seventh calculation result; and a selector, providing the counting signal to the internal voltage generation unit when the seventh calculation result is valid, and providing the first latch signal to the internal voltage generation unit when the seventh calculation result is invalid.

16. The initial setting device as defined in claim 1, wherein when the first time reading is performed on the first non-volatile memory device, the first time reading of the first non-volatile memory device is performed in a state in which an internal voltage of the first non-volatile memory device has not been adjusted based on the first setting information stored in the first non-volatile memory device; and when the second time reading is performed on the first non-volatile memory device, the second time reading is performed in a state in which the internal voltage is adjusted based on the first setting information read from the first non-volatile memory device by the first time reading.

* * * * *